(12) United States Patent
Hashimoto

(10) Patent No.: US 6,597,038 B1
(45) Date of Patent: Jul. 22, 2003

(54) MOS TRANSISTOR WITH DOUBLE DRAIN STRUCTURE FOR SUPPRESSING SHORT CHANNEL EFFECT

(75) Inventor: Shingo Hashimoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/252,664

(22) Filed: Feb. 19, 1999

(30) Foreign Application Priority Data

Feb. 24, 1998 (JP) ............................................ 10-042588

(51) Int. Cl.⁷ .......................... H01L 29/78; H01L 29/167
(52) U.S. Cl. ........................................ 257/344; 257/917
(58) Field of Search .................................. 257/344, 917

(56) References Cited

U.S. PATENT DOCUMENTS

| | | | | |
|---|---|---|---|---|
| 4,928,163 A | * | 5/1990 | Yoshida et al. | 257/344 |
| 4,935,379 A | * | 6/1990 | Toyoshima | 257/344 |
| 5,719,424 A | * | 2/1998 | Ahmad et al. | 257/917 |
| 5,920,104 A | * | 7/1999 | Nayak et al. | 257/344 |
| 5,945,710 A | * | 8/1999 | Oda et al. | 257/344 |
| 5,952,693 A | * | 9/1999 | Wu et al. | 257/917 |
| 6,137,137 A | * | 10/2000 | Wu | 257/344 |

FOREIGN PATENT DOCUMENTS

| | | |
|---|---|---|
| JP | 1-94667 | 4/1989 |
| JP | 399441 | 4/1991 |
| JP | 3120836 | 5/1991 |
| JP | 536719 | 2/1993 |
| JP | 5-36719 | 2/1993 |
| JP | 6-188429 | 7/1994 |
| JP | 7147397 | 6/1995 |
| JP | 7297393 | 11/1995 |
| JP | 63-73669 | 4/1998 |

OTHER PUBLICATIONS

Stanley Wolf, Ph.D., *Silicon Processing for the VLSI Era*, vol. 3, Lattice Press, Sunset Beach, California, 1995, pp. 617–621.

* cited by examiner

*Primary Examiner*—Gene M. Munson
(74) *Attorney, Agent, or Firm*—Young & Thompson

(57) ABSTRACT

The present invention discloses a semiconductor device, and a method of fabricating the same, where the semiconductor device has a gate electrode, a source-drain diffused layer of a first conductivity type, and a sidewall insulating film formed on the side face of the gate electrode, wherein the source-drain diffused layer has a lightly doped region formed below the sidewall insulating film, and a heavily doped region with impurity concentration higher than that of the lightly doped region, and the lightly doped region includes at least two kinds of impurities of the first conductivity type.

6 Claims, 14 Drawing Sheets

MOS TRANSISTOR WITH DOUBLE DRAIN STRUCTURE FOR SUPPRESSING SHORT CHANNEL EFFECT

BACKGROUND OF THE INVENTION

1. Field of the Invention

The present invention relates to a structure of a MOS transistor, and more particularly to a structure of a MOS transistor exhibiting an enhanced current drive capability while maintaining a high resistance to hot carriers.

2. Description of the Related Art

In recent years, various kinds of problems originating from the generation of hot carriers are being revealed accompanying the advances in fine patterning of the MOS transistor. This is caused by the circumstance that despite the reduction in the gate length of the MOS transistor as a result of fine patterning, its operating voltage is not lowered in proportion to the reduction in the gate length.

As a technique of realizing fine patterning without deteriorating the characteristics of the MOS transistor there has been known the scaling rule. This is a technique by which circuit parameters, such as the power supply voltage, are reduced in proportion to the reduction in the gate length. Thus, according to the scaling rule, when the channel length L is reduced to 1/k of its value, for example, the power supply voltage is also reduced to 1/k of the original value in the same manner as for the channel length. In practice, however, the MOS transistor is operated without reducing the power supply voltage to 1/k as required by the scaling rule. The reasons for the negligence of the rule are due to disadvantages that a satisfactory improvement effect of circuit characteristics cannot be obtained when the MOS transistor is operated at a low power supply voltage according to the scaling rule, and that it requires the supply of such a low power supply voltage from the outside. For these reasons, in the actual integrated circuits, MOS transistors are being used with reduced channel length but without corresponding change in the power supply voltage.

When fine patterning of the MOS transistor is promoted without lowering the power supply voltage, as in the above, the internal electric field of the MOS transistor is increased all the more. The internal electric field of the MOS transistor shows a maximum value in the vicinity of the drain, and impact ionization takes place in that region. Carriers gaining high energy generated by this phenomenon are referred to as hot carriers.

These hot carriers cause a variety of problems which harm the reliability of the MOS transistor. For example, traps and surface levels may be created by the implantation of the hot carriers into the gate oxide film, and the characteristics of the MOS transistor will be changed by the capture of the hot carriers by the traps and surface levels. As a result, a change in the threshold voltage and reduction in the transconductance gm will be brought about. Under these circumstances, various MOS transistor structures have been proposed in order to suppress the generation of the hot carriers which cause these problems. The doubly diffused drain (DDD) structure and the lightly doped drain (LDD) are examples of them. Both of the MOS transistors with DDD structure and LDD structure are structures provided with a lightly doped impurity region in parts close to the channel region of the drain region intended for relaxation of the electric field intensity.

The MOS transistor with DDD structure and the MOS transistor with LDD structure will now be described in the following.

First, the structure and the fabrication method of the MOS transistor with DDD structure will be described. FIG. 10(a) through FIG. 11(b) are sectional views showing the fabrication method of the MOS transistor with DDD structure arranged in the order of processes.

First, as shown in FIG. 10(a), an element isolation insulating film 52 is formed by a selective oxidation method on the surface of a p-type semiconductor substrate 51. Then, a gate oxide film 53 is formed by subjecting the sample to a thermal oxidation.

Next, as shown in FIG. 10(b), a gate electrode 54 is formed on the gate oxide film 53.

Then, as shown in FIG. 10(c), a first n-type impurity, phosphorus 55, is implanted into the p-type semiconductor substrate 51 by ion implantation. By so doing, a first n-type impurity layer 55a is formed in self-alignment with the gate electrode 54. In this case, the ion implantation energy is 20–30 keV, and the dose of the ions is $1 \times 10^{14}$ to $5 \times 10^{14}$ $cm^{-2}$ Further, as shown in FIG. 11(a), a second n-type impurity, arsenic 54, is implanted into the p-type semiconductor substrate 51 by ion implantation. By so doing, a second n-type impurity layer 56a is formed in selfalignment with the gate electrode 54. In this case, the ion implantation energy is 30–50 keV, and the dose is $1 \times 10^{15}$ to $5 \times 10^{15}$ $cm^{-2}$.

Next, after forming a layer insulating film 60 on the entire surface and forming a contact hole, phosphorus 55 and arsenic 56 implanted in the p-type semiconductor substrate are thermally diffused by subjecting the sample to a heat treatment. In this case, since an impurity with a large diffusion coefficient diffuses to a wider area than an impurity with a small diffusion coefficient does, phosphorus having a larger diffusion coefficient compared with arsenic diffuses over a wider area. Because of this, as shown in FIG. 11(b), there is obtained a structure (DDD structure) in which the impurity layer containing phosphorus with larger diffusion coefficient surrounds the periphery of the impurity layer containing arsenic with smaller diffusion coefficient.

Next, the structure and a method of fabrication of a MOS transistor with LDD structure will be described. FIG. 12(a) through FIG. 13(c) are sectional views showing the fabrication method of a MOS transistor with LDD structure arranged in the order of fabrication processes.

As shown in FIG. 12(a), an element isolation film 72 is formed on the surface of a p-type semiconductor substrate by selective oxidation. Then, a gate oxide film 73 is formed by subjecting the sample to a thermal oxidation.

Next, as shown in FIG. 12(b), a gate electrode 74 is formed on the gate oxide film 73.

Then, as shown in FIG. 12(c), a first n-type impurity, phosphorus 75, is implanted into the p-type semiconductor substrate 71 by ion implantation. By so doing, a first n-type impurity layer 75a is formed in self-alignment with the gate electrode 74. In this case, the ion implantation energy is 20–30 keV, and the dose is $5 \times 10^{12}$ to $5 \times 10^{13}$ $cm^{-2}$.

Then, as shown in FIG. 13(a), a sidewall insulating film 77 is formed on the sidewall of the gate electrode 74. This sidewall insulating film 77 is obtained by forming an insulating film such as silicon oxide film on the principal surface of the semiconductor substrate using CVD or the like, then removing the component corresponding to the thickness of the formed insulating film by an isotropic etching.

Next, as shown in FIG. 13(b), a second n-type impurity, arsenic 76, is implanted into the p-type semiconductor substrate 71. By so doing, a second n-type impurity layer 76a is formed in self-alignment with the gate electrode 74 and the sidewall insulating film 77. In this case, the ion implantation energy is 30–50 keV, and the dose is $1\times10^{15}$ to $5\times10^{15}$ cm$^{-2}$.

Next, as shown in FIG. 13(c), after forming a layer insulating film 80 on the entire surface and forming a contact hole or the like, a metallic wiring 84 is formed selectively, completing a MOS transistor with LDD structure. However, the MOS transistor with DDD structure has a problem in that it tends to give rise to the short channel effect. As is well known, the short channel effect is a phenomenon in which a depletion layer extending from the source-drain diffused layer affects the depletion layer extending from the MOS surface to reduce the effective impurity concentration of the substrate. This effect gives rise to various kinds of problems related directly to the abnormality or reduction in the reliability of the circuit operation, such as the lowering of the threshold voltage, the increase in the dependence of the threshold voltage on the drain voltage, or the like. In particular, as the gate length is decreased to less than 1 □m, the rate of the width of the depletion layer extending from the source-drain diffused layer to the gate length becomes considerably large, and the short channel effect is exhibited more conspicuously.

As the cause of generation of the short channel effect, there may be mentioned the involvement of the thickness W of the MOS surface depletion layer and the P-N junction depletion layer, and the junction depth Xj of the sourcedrain diffused layer. Generally speaking, it is believed that the short channel effect is less likely to occur, and hence is more preferable, when the values of the thickness W of these depletion layers and the junction depth Xj are small. That the short channel effect is liable to occur in the MOS transistor with DDD structure is precisely due to these reasons. Namely, since two kinds of impurities with different diffusion coefficients are thermally diffused in the fabrication process of the MOS transistor with DDD structure, even though one kind of impurity is implanted in self-alignment with the gate electrode in advance, the impurity ions in the subsequent implantation diffuse into the gate electrode side (channel side) such that the impurity layer overlaps with the gate electrode. As a result, the distance between the source and the drain, which is the effective gate length, becomes small. Moreover, since the impurity ions diffuse isotropically, they also diffuse toward the lower side of the substrate, increasing the junction depth (Xj) of the source-drain diffused layer. As a result, the short channel effect tends to occur easily in this case.

Moreover, if in the MOS transistor with LDD structure the impurity concentration of the impurity layer (LDD layer) directly below the sidewall insulating film is high, the short channel effect tends to occur by the same reasons as in the MOS transistor with DDD structure. On the other hand, if the impurity concentration in the LDD layer is low, the electric field strength in the vicinity of the drain becomes high, which makes easier generation of the hot carriers and increases the parasitic resistance. These factors work as the causes for lowering the driving current.

Furthermore, since the parameters determining the maximum electric field strength of the LDD structure depend strongly on the impurity concentration in the LDD region and the width of the sidewall insulating film, there is a tendency of designing the width of the sidewall insulating film to be small in order to enhance the current drive capability of the MOS transistor. Needless to say, making the width of the sidewall insulating film small, leads to the reduction in the size of the LDD region and the reduction in the relaxation effect of the electric field strength.

Moreover, in the case of an n-channel MOS transistor, the impurity to be implanted into the LDD region is normally phosphorus. However, if ions of an impurity are implanted to such an extent as to reduce the parasitic resistance, impurity diffusion will take place during the heat treatment in the fabrication process, resulting in the generation of the short channel effect as described above. In order to prevent the diffusion of the impurity in the lateral direction, for example, the impurity to be implanted into the LDD region may be switched from phosphorus to arsenic which has a relatively small diffusion coefficient. However, arsenic has a steeper concentration gradient than phosphorus, and changes the carrier distribution markedly, so that it gives rise to a separate problem of increasing the electric field strength.

On the other hand, various kinds of fabrication methods of the MOS transistor aimed at the reduction of the short channel effect and the suppression of generation of hot carriers have been proposed (for example, Publication of Unexamined Patent Applications, No. Sho 63-73669). FIG. 14(a) to FIG. 15(c) are sectional views for describing the fabrication method of MOS transistor arranged in the order of its fabrication processes disclosed in Publication of Unexamined Patent Applications, No. Sho 63-73669. In the method of fabrication described in the Publication, as shown in FIG. 14(a), first, an element isolation film 92 is formed on a p-type semiconductor substrate 91 by selective oxidation. Next, a gate oxide film 93 is formed by subjecting the sample to a thermal oxidation.

Then, ions of phosphorus 95 being a first n-type impurity are implanted to form a first n-type impurity layer 95a. In this case, the implantation energy of ions is about 70 keV, and its dose is $1\times10^{11}$ to $1\times10^{12}$ cm$^{-2}$.

Next, as shown in FIG. 14(b), a gate electrode 94 is formed on the gate insulating film 93.

Then, as shown in FIG. 14(c), a first resist mask 102 covering the planned region for drain formation and having an opening in the planned region for source formation is formed. After that, ions of boron 101 being a first p-type impurity are implanted into the principal surface of the semiconductor substrate, to form a first p-type impurity layer 101a. In this case, the energy of ion implantation is about 25 keV, and its dose is $1\times10^{12}$ to $1\times10^{14}$ cm$^{-2}$.

Further, as shown in FIG. 15(a), after removal of the first resist mask 102, a second resist mask 103 covering the planned region for source formation and having an opening in the planned region for drain formation is formed. After that, phosphorus 106 being a second n-type impurity is implanted into the principal surface of the semiconductor substrate to form a second n-type impurity layer 106a. In this case, the ion implantation energy is about 70 keV, and its dose is about $5\times10^{13}$ cm$^{-2}$.

Next, as shown in FIG. 15(b), ions of arsenic being a third n-type impurity are implanted to form a third n-type impurity layer 98a in self-alignment with a gate electrode 104. In this case, the ion implantation energy is about 70 keV, and its dose is about $4\times10^{15}$ cm$^{-2}$.

Then, after forming a layer insulating film 100 on the entire surface and forming a contact hole or the like, a structure as shown in FIG. 15(c) is obtained by subjecting the sample to a heat treatment.

In the MOS transistor fabricated by this method the drain has a double structure consisting of two kinds of n-type impurities so that the generation of hot carriers is suppressed. In addition, the source has a double structure having both of an n-type and a p-type impurities, and a depletion region is formed below the gate electrode which forms a local enhancement region. As a result of combination of these the short channel effect is effectively suppressed.

However, the MOS transistor fabricated according to this method has a limitation for the application to devices having a gate length of submicron order, because it has a double drain structure. Moreover, since the formation of a transistor with an asymmetric source-drain structure requires a large number of lithography processes for the formation of an n-channel MOSFET, it leads to a problem that a huge amount of time and cost is needed.

In addition to the fabrication method described in the above, there is proposed a method of fabrication of a semiconductor device which reduces the resistance between a conductive layer filled in a contact hole and a diffused layer (Publication of Unexamined Patent Applications, No. Hei 1-94667). In the fabrication method disclosed in this Publication, phosphorus ions are implanted following the implantation of arsenic ions into a polycrystalline silicon film. The implantation energy of arsenic ions is 20 to 100 keV and its dose is $1 \times 10^{15}$ to $1 \times 10^{17}$ cm$^{-2}$, and the ion implantation energy of phosphorus is 40 to 150 keV and its dose is $1 \times 10^{13}$ to $1 \times 10^{15}$ cm$^{-2}$. With this arrangement, the range of phosphorus implantation becomes closer to the thickness of the polycrystalline silicon film than to the range of arsenic implantation, and a peak of impurity distribution appears in the vicinity of interface with a silicon substrate.

In a semiconductor device fabricated in this manner, it is possible to take both of the advantage of phosphorus ion implantation and the advantage of arsenic ion implantation, so that the junction depth (Xj) of the source-drain diffused layer can be made small and the resistance to hot carriers can be enhanced.

Moreover, fabrication method of semiconductor device which obviates the thermal diffusion process has been proposed (Publication of Unexamined Patent Applications, No. Hei 5-36719). In the fabrication method of the semiconductor device disclosed in this Publication, first, ions of an n-type impurity such as phosphorus are implanted at a dose of about $1 \times 10^{13}$ cm$^{-2}$ in the direction tilted by 45° to the surface of a semiconductor substrate. Next, ions of an n-type impurity such as phosphorus or arsenic are implanted at a dose of about $1 \times 10^{14}$ cm$^{-2}$ in the direction tilted by 45° to the surface of the substrate. Then, ions of an n-type impurity such as arsenic are implanted at a dose of about $1 \times 10^{15}$ cm$^{-2}$ in the direction perpendicular to the substrate surface.

According to such a method, ions of n-type impurities are implanted for two times in the direction tilted by 45° to the semiconductor substrate, so that the thermal diffusion process for impurity diffusion becomes unnecessary, and it is possible to form a MOS transistor with LDD structure in which a low concentration impurity layer is aligned at high precision with the gate electrode.

Still further, in a semiconductor device having a floating gate which is used for an EEPROM or the like, a semiconductor device with drain diffused layer of double layer structure has been proposed (Publication of Unexamined Patent Applications, No. Hei 6-188429). In the semiconductor device disclosed in this Publication, a floating gate is formed on a gate oxide film, and a control gate is formed on the floating gate via an insulating film. Further, a drain diffused layer is composed of a heavily doped region and a lightly doped region surrounding the heavily doped region having an impurity concentration lower than that of the heavily doped region.

With such a structure it is possible to make the drain diffused layer to be resistant to high voltage, and as a result to improve the number of times of rewriting when the structure is applied to a storage device.

However, with these techniques it is difficult to make the suppression of the hot carrier generation and the suppression of the short channel effect compatible.

Now, a high speed operation is required for semiconductor integrated circuits of recent years, and more particularly a high current drive capability is demanded of the MOS transistors. Although the reduction in the width of the sidewall insulating film is desired in order to improve the current drive capability, it results in an increase in the maximum electric field strength which promotes the generation of the hot carriers, as mentioned above. On the other hand, if the impurity amount of phosphorus, to be ion implanted into the LDD region for the purpose of relaxing the maximum current drive capability, is increased, the overlap of the LDD region with the gate electrode is increased and the short channel effect is promoted. In this way, there is a problem in that the reliability of the MOS transistor is deteriorated if one tries to enhance the current drive capability.

Moreover, as the width of the sidewall insulating film is decreased in the MOS transistor with LDD structure, the sidewall insulating film behaves as if it is a gate oxide film, and the generated hot carriers are implanted not only into the gate oxide film but also into the sidewall insulating film, which gives rise to a problem that the characteristics of the MOS transistor are deteriorated substantially.

SUMMARY OF THE INVENTION

It is therefore an object of the present invention to provide an improved semiconductor device, which is capable of suppressing the short channel effect without deteriorating the current drive capability of the MOS transistor, and to reduce the generation of the hot carriers.

The semiconductor device according to the present invention includes a semiconductor substrate having a channel region, a gate insulating film formed on said channel region, a gate electrode formed on a said gate insulating film, said gate electrode having side surfaces, side walls formed on an associated one of said side surfaces of said gate electrode, source and drain regions formed in said semiconductor substrate, and LDD regions formed in said semiconductor substrate, each of which is covered with an associated one of said side walls, each of said LDD regions including at least two kinds of impurities.

BRIEF DESCRIPTION OF THE DRAWINGS

The above-mentioned and other objects, features, and advantages of this invention will become more apparent by reference to the following detailed description of the invention taken in conjunction with the accompanying drawings, wherein:

FIG. 4(a) is a sectional view and FIG. 4(b) is a graph showing the concentration distribution of the impurity;

FIG. 5(a) is a sectional view and FIG. 5(b) is a graph showing the concentration distribution of the impurity;

DESCRIPTION OF PREFERRED EMBODIMENTS

In the following, MOS transistors according to the embodiments of this invention will be described in the order of their fabrication processes.

Figure 1A:
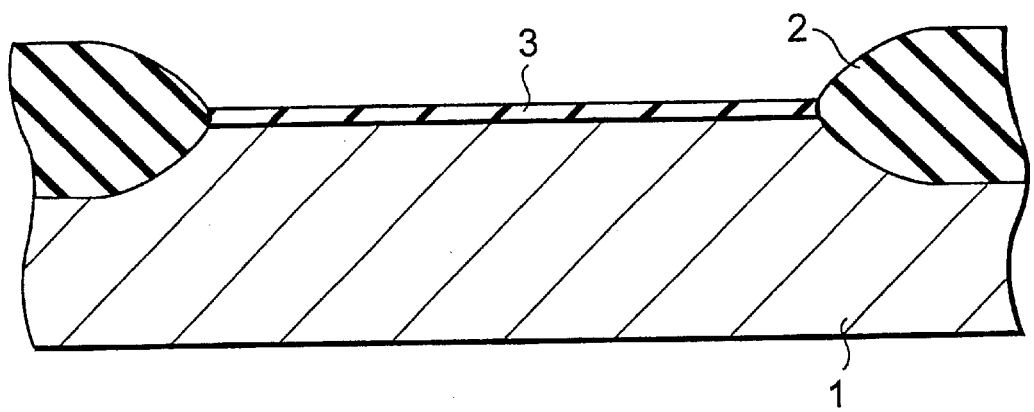
FIGS. 1(a) to 1(c) shows sectional views arranged in the order of fabrication processes of the MOS transistor according to a first embodiment of the invention.

In the MOS transistor according to an embodiment of this invention, first, in order to electrically isolate various elements to prescribed regions on a p-type semiconductor substrate 1, an oxide film (element isolation insulating film 2) with thickness of 300 to 500 nm is formed by selectively oxidizing the surface of the p-type semiconductor substrate 1, as shown in FIG. 1(a). After that, a gate oxide film 3 with thickness of 7 to 15 nm is formed by thermal oxidation between the element isolation insulating film 2. Here, although not shown in FIG. 1(a), a well may be formed by thermal diffusion or high energy ion implantation technique.

Figure 1B:
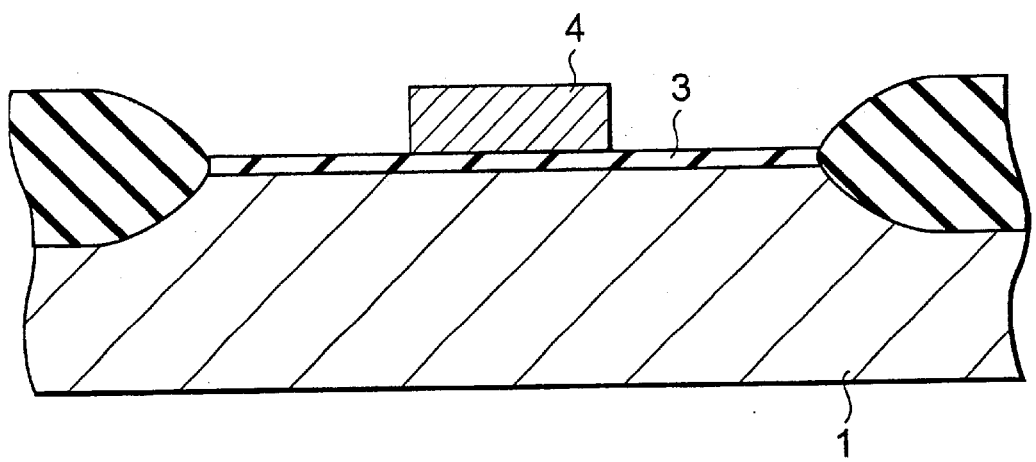

Next, as shown in FIG. 1(b), a gate electrode 4 is formed selectively on the gate oxide film 3 by forming a polycrystalline silicon layer on the entire surface by CVD and patterning it using lithography technique. Here, the gate electrode 4 may be made exclusively of polycrystalline silicon, or may be made as a lamination of a polycrystalline silicon layer and a high melting point metallic layer consisting of a high melting point material such as WSi. In this invention, the material of the gate electrode 4 is of no concern.

Figure 1C:
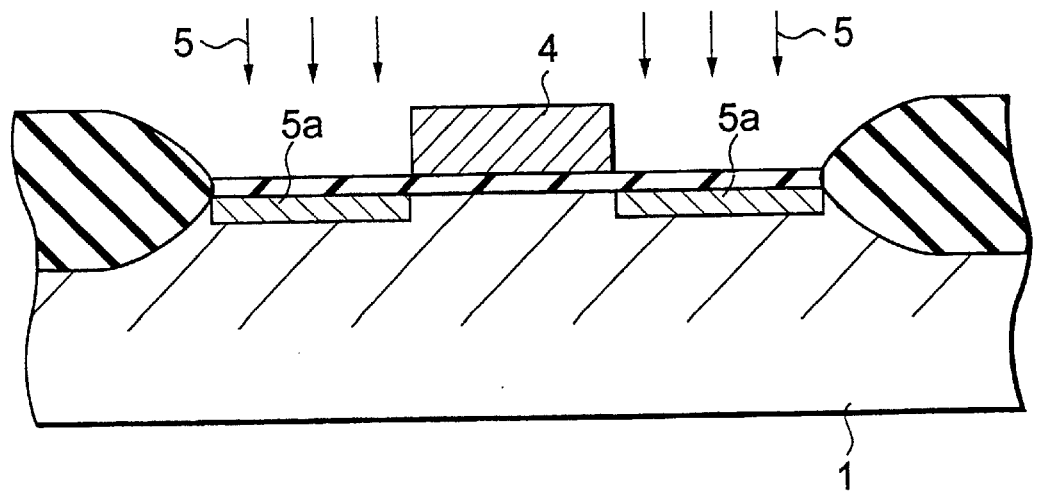

Next, as shown in FIG. 1(c), ions of phosphorus are implanted by ion implantation method perpendicularly to the semiconductor substrate 1 using the gate electrode 4 as a mask. By so doing, a first n-type impurity layer 5a is formed in self-alignment with the gate electrode 4. The ion implantation energy at this time is 20 to 40 keV, and its dose is $5 \times 10^{12}$ to $5 \times 10^{13}$ cm$^{-2}$.

Figure 2A:
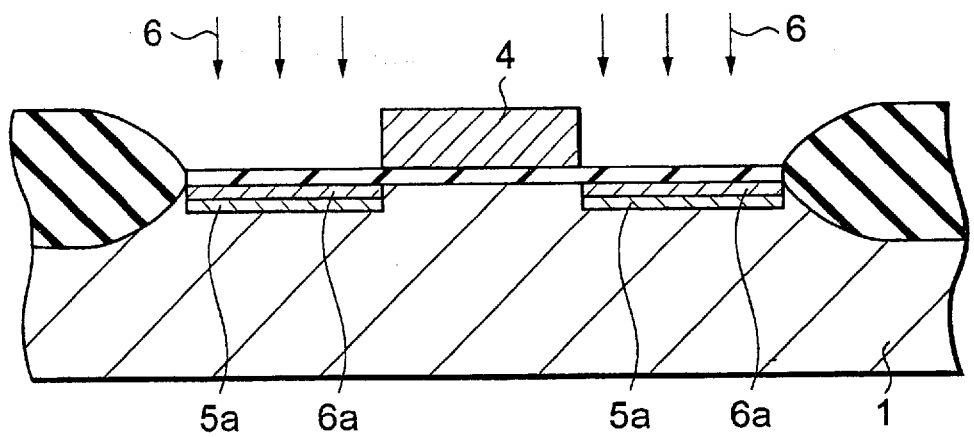
FIGS. 2(a) to 2(c) shows sectional views for the steps following the steps of FIG. 1(a) to FIG. 1(c)

Further, as shown in FIG. 2(a), ions of arsenic 6 are implanted by ion implantation method perpendicularly to the semiconductor substrate using the gate electrode 4 as a mask. By so doing, a second n-type impurity layer 6a is formed in self-alignment with the gate electrode 4. The ion implantation energy at this time is 30 to 50 keV, and its dose is $5 \times 10^{12}$ to $5 \times 10^{13}$ cm$^{-2}$.

Figure 2B:
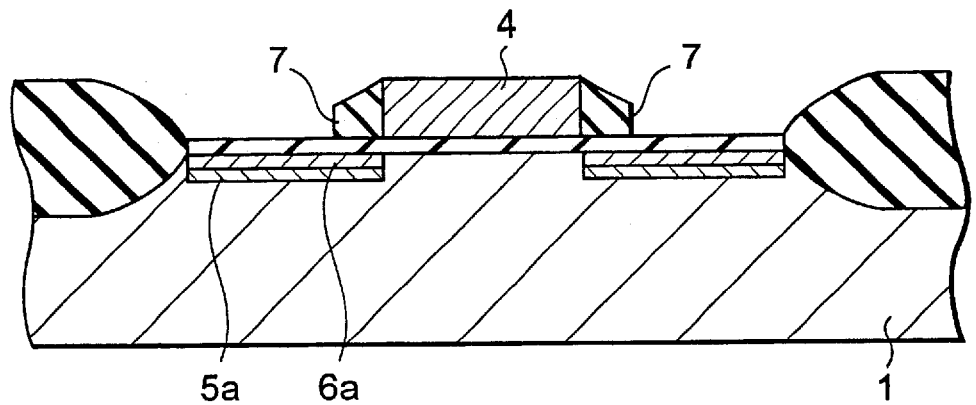

Next, as shown in FIG. 2(b), by forming an oxide film on the entire surface to a thickness of 100 to 200 nm by CVD and anisotropically etching back the film, a sidewall insulating film 7 is formed on the side face of the gate electrode 4. The n-type impurity layers 5a and 6a located below the sidewall insulating film 7 thus formed serve as an LDD region.

Figure 4A:
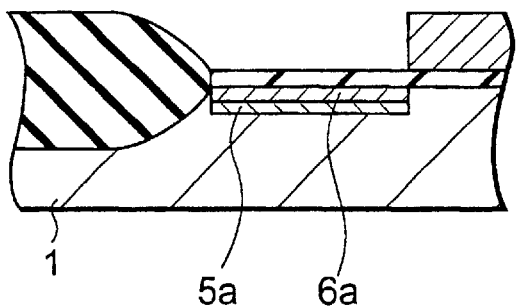
FIGS. 4(a) and 4(b) presents diagrams showing the state immediately after the formation of the second n-type impurity layer in the first embodiment, where
Figure 4B:
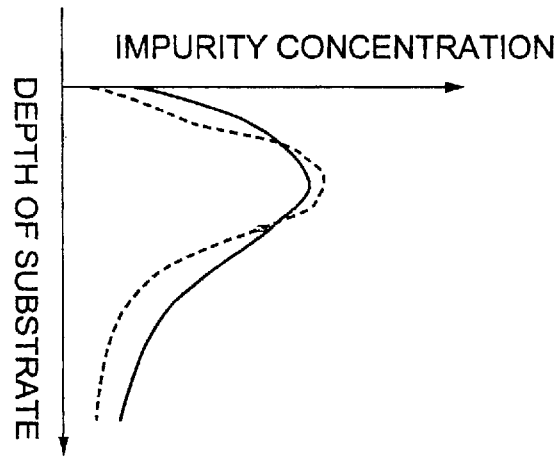

FIG. 4 presents diagrams showing the relation between the impurity concentration and the depth from the surface of the substrate at immediately after the formation of the second n-type impurity layer 6a. FIG. 4(a) is a sectional view of the relevant part, and FIG. 4(b) is a graph showing the concentration of distribution of various impurities by taking the substrate depth as the ordinate and the impurity concentration as the abscissa. In FIG. 4(b), the solid line shows the concentration distribution of the phosphorus layer 5a, and the broken line shows the concentration distribution of the arsenic layer 6a. For the implantation energy of phosphorus 5 and the implantation energy of arsenic 6 in this embodiment, the respective concentration peaks appear at substantially the same depth of the semiconductor substrate 1, and the concentration distributions are also substantially the same. In other words, at immediately after the ion implantation of phosphorus 5 and arsenic 6 into the semiconductor substrate, both impurities are distributed mixed at substantially the same region without forming a double drain structure.

Figure 2C:
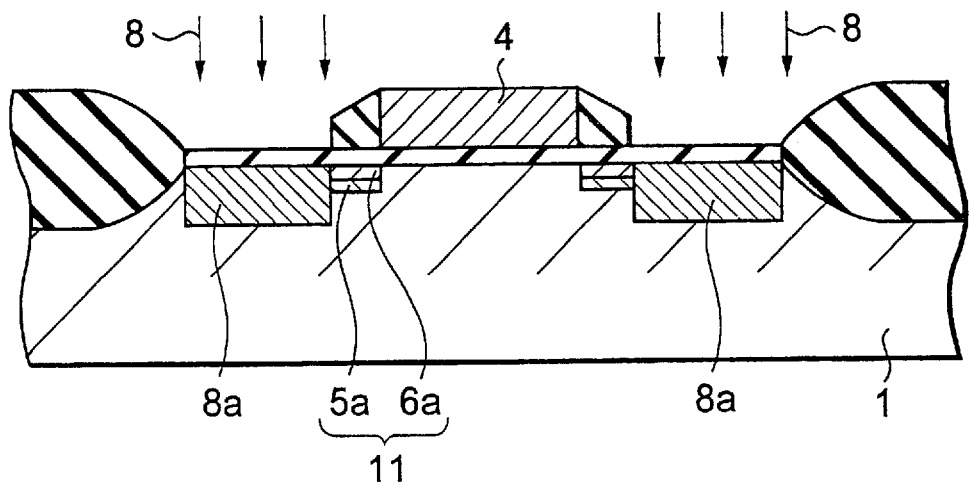

Returning again to the process diagrams, as shown in FIG. 2(c), after forming the sidewall insulating film 7 on the sidewall of the gate electrode 4, ions of phosphorus 8 are implanted perpendicularly to the semiconductor substrate 1 by ion implantation method using the gate electrode 4 and the sidewall insulating film 7 as masks. By so doing, a third n-type impurity layer 8a is formed in self-alignment with the gate electrode 4 and the sidewall insulating film 7. The ion implantation energy at this time is 20 to 40 keV, and its dose is $1 \times 10^{13}$ to $5 \times 10^{14}$ cm$^{-2}$.

Figure 3A:
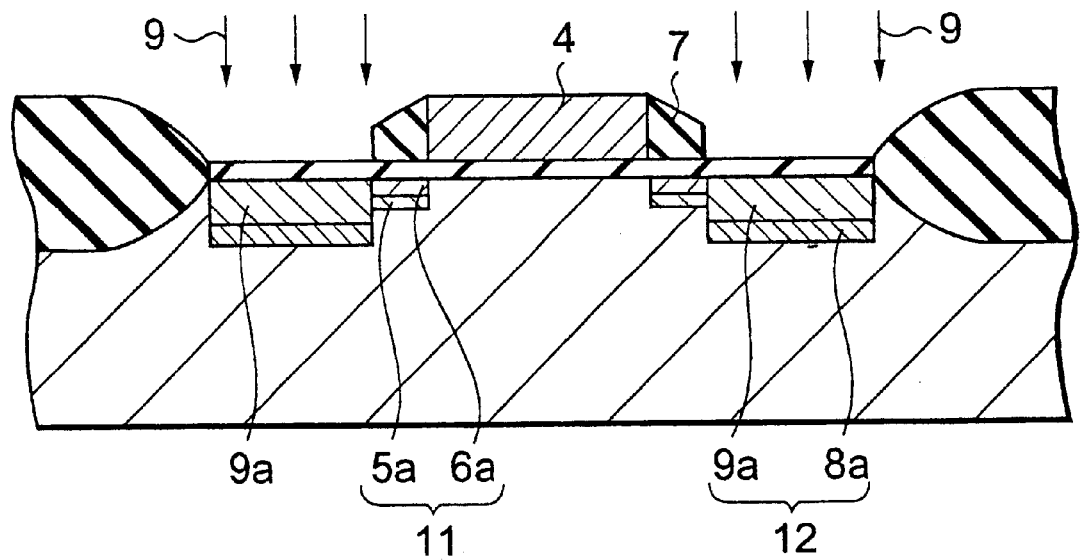
FIGS. 3(a) and 3(b) shows sectional views for the steps following the steps of FIG. 2(a) to FIG. 2(c)

Further, as shown in FIG. 3(a), ions of arsenic 9 are implanted by ion implantation method perpendicularly to the semiconductor substrate 1 using the gate electrode 4 and the sidewall insulating film 7 as masks. By so doing, a fourth impurity layer 9a is formed in self-alignment with the gate electrode 4 and the sidewall insulating film 7. The ion implantation energy at this time is 30 to 50 keV, and its dose is $5 \times 10^{14}$ to $5 \times 10^{15}$ cm$^{-2}$. The third n-type impurity layer 8a and the fourth n-type impurity layer 9a serve as source-drain high concentration region in the MOS transistor. At immediately after the formation of the third n-type impurity layer 8a and the fourth n-type impurity layer 9a, the concentration peaks of these layers have substantially the same concentration peaks similar to the relation between the first n-type impurity layer 5a and the second n-type impurity layer 6a.

Then, the sample is subjected to a heat treatment in order to activate these impurity regions. This heat treatment may be done in common to the heat treatment to be given later for the reflow process.

In general, an impurity having a larger diffusion coefficient has a larger distance of diffusion. Of the n-type impurities phosphorus has a larger diffusion coefficient than arsenic so that by a heat treatment given after ion implantation of arsenic 9, phosphorus diffuses over a wider region.

Figure 5A:
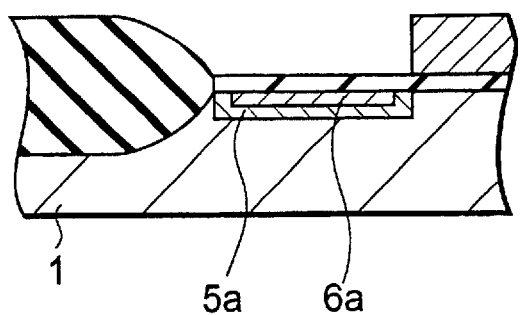
FIGS. 5(a) and 5(b) presents diagrams showing the state immediately after a heat treatment in the first embodiment, where
Figure 5B:
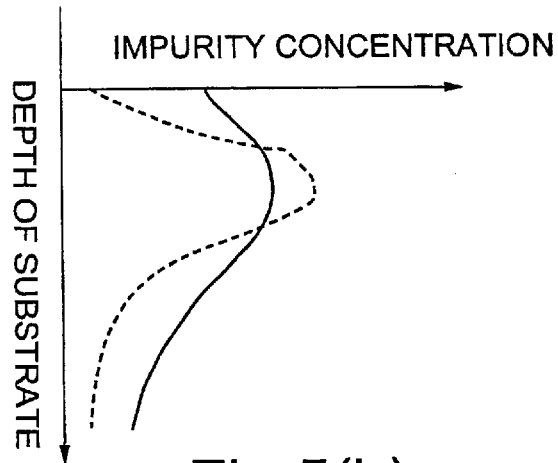

FIG. 5 presents diagrams showing the relation between the impurity concentration and the depth from the surface of the substrate at immediately after the heat treatment. FIG. 5(a) is a sectional view of the relevant part, and FIG. 5(b) is a graph showing the concentration distribution of the impurity by taking the depth from the surface of the substrate as the ordinate, and the impurity concentration on the abscissa. In FIG. 5(a), the third n-type impurity layer 8a and the fourth n-type impurity layer 9a are omitted for convenience, and in FIG. 5(b), the solid line is for phosphorus 5, and the broke line is for arsenic 6.

As can be seen from FIG. 5(a), after the heat treatment, the first n-type impurity layer 5a into which phosphorus is introduced surrounds the periphery of the second n-type impurity layer 6a into which arsenic 6 is introduced. In the impurity distribution of the LDD region 11, as shown in FIG. 5(b), phosphorus is distributed so as to relax the steep concentration gradient of arsenic. In this manner, the LDD region 11 consisting of a double drain structure can be obtained.

Figure 6:
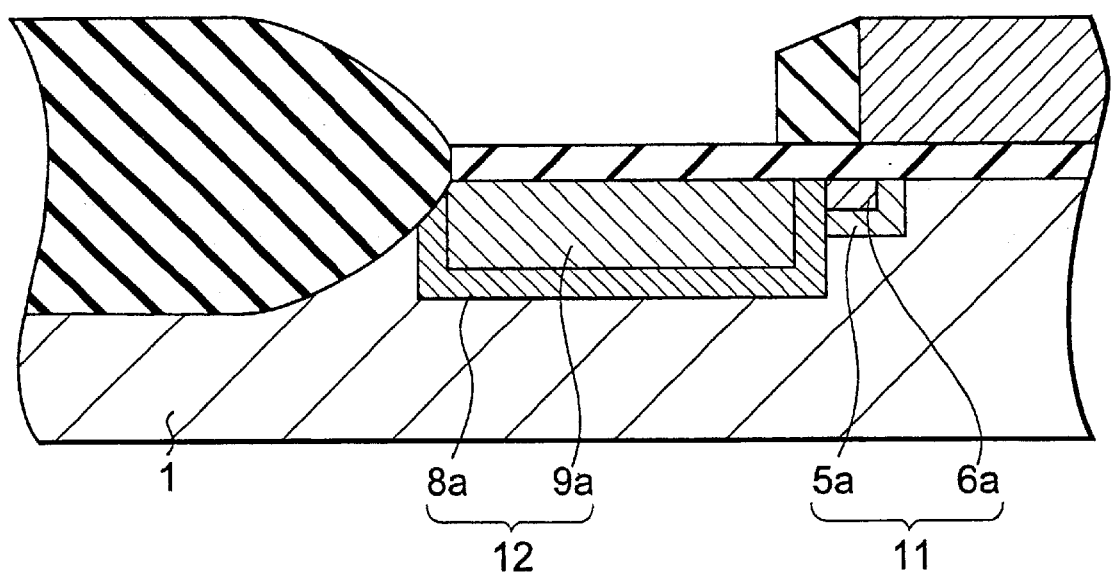
FIG. 6 is a sectional view showing the state immediately after the heat treatment in the first embodiment.

FIG. 6 is a sectional view immediately after the heat treatment is performed. In the MOS transistor of this embodiment, phosphorus 8 is used for the third n-type impurity layer and arsenic 9 is used for the fourth n-type impurity layer, so that the heavily doped region 12 also has a double drain structure as shown in FIG. 6.

By forming a double drain structure for the LDD region as in the above, it is possible to suppress the enhancement of the electric field while minimizing the short channel effect. At the same time, by giving a double drain structure also to the heavily doped region 12, phosphorus 5 or arsenic 6 in the heavily doped region 12 diffuses into the LDD region 11 to reduce the parasitic capacitance of the LDD region 11, so that reduction in the current drive capability can also be prevented.

Here, by appropriately setting the width of the sidewall insulating film and the amount of impurity to be ion implanted, phosphorus or arsenic diffusing from the heavily doped region 12 will not become the factor for the generation of the short channel effect.

Figure 3B:
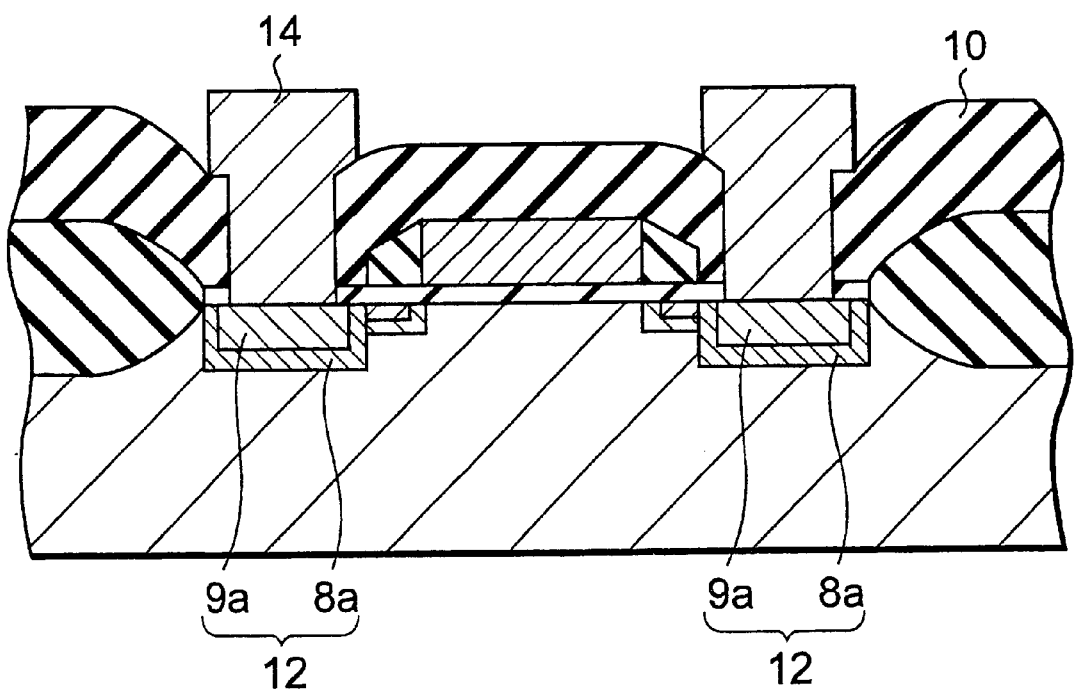

Returning to the process diagrams again, as shown in FIG. 3(b), after depositing a layer insulating film 10 on the entire surface and forming a contact hole, a metallic wiring 14 is formed selectively, completing the MOS transistor of this embodiment.

In the MOS transistor of this embodiment thus fabricated, there are employed double drain structure in both of the LDD region 11 and the heavily doped region of the source-drain diffused layer having the LDD structure, as shown in FIG. 3(b). Because of this, as mentioned above, it is possible not only to suppress the enhancement of the electric field while minimizing the short channel effect, but also to prevent the deterioration in the current drive capability by reducing the parasitic capacitance of the LDD region 11 through diffusion of phosphorus 5 or arsenic 6 in the heavily doped region 12 into the LDD region 11.

Next, the MOS transistor according to a second embodiment of this invention will be described by reference to the process diagrams FIG. 7(a) to FIG. 9.

Figure 7A:
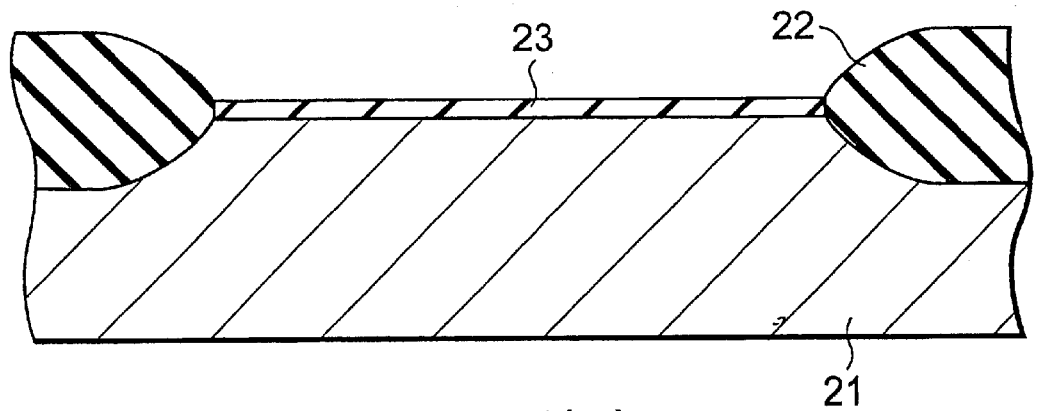
FIGS. 7(a) to 7(c) shows sectional views arranged in the order of fabrication processes of the MOS transistor according to a second embodiment of the invention.

In the fabrication of the MOS transistor according to this embodiment, in order to electrically isolate individual elements to specified regions on a p-type semiconductor substrate, an oxide film (element isolation insulating film 22) with thickness of 300 to 500 nm is formed first by selectively oxidizing the surface of a p-type semiconductor substrate 21, as shown in FIG. 7(a). After that, a gate oxide film 23 with thickness of 7 to 15 nm is formed between the element isolation insulating film 22 by subjecting the sample to a thermal oxidation.

Figure 7B:
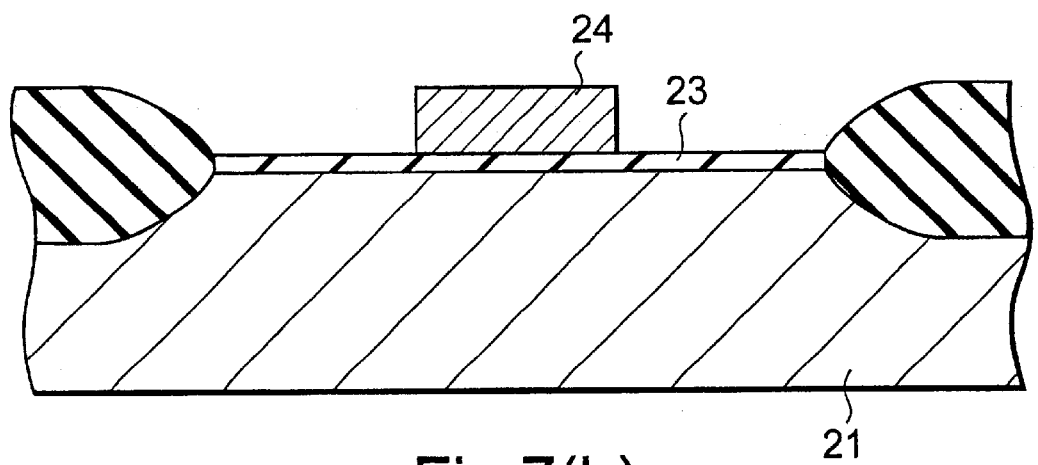

Next, as shown in FIG. 7(b), a polycrystalline silicon layer is formed on the entire surface by CVD, and a gate electrode 24 is formed on the gate oxide film 23 by patterning the polycrystalline silicon layer using lithography technique. The gate electrode 24 may be formed exclusively of a polycrystalline silicon layer, or may be a lamination of a polycrystalline silicon layer and a high melting point metallic layer consisting of such high melting point material as WSi, but its material is of no concern.

Figure 7C:
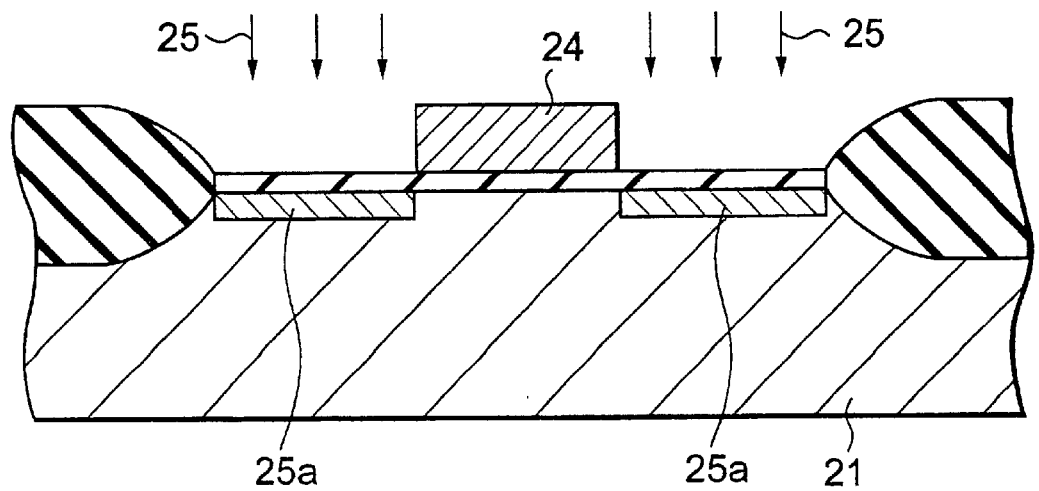

Next, as shown in FIG. 7(c), ions of phosphorus 25 are implanted perpendicularly to the semiconductor substrate 21 using the gate 24 as a mask. By so doing, a first n-type impurity layer 25a is formed in self-alignment with the gate electrode 24. The ion implantation energy at this time is 20 to 30 keV, and its dose is $5 \times 10^{12}$ to $5 \times 10^{13}$ cm$^{-2}$.

Figure 8A:
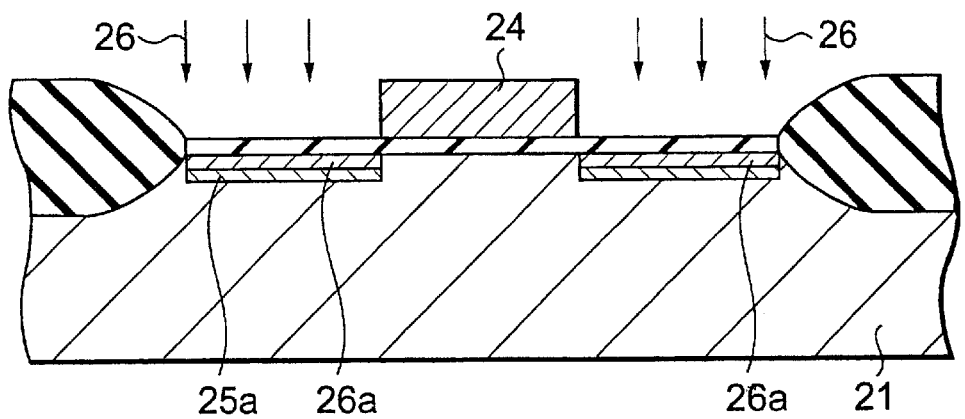
FIGS. 8(a) to 8(c) shows sectional views for the steps following the steps of FIG. 7(a) to FIG. 7(c)

Further, as shown in FIG. 8(a), ions of arsenic 26 are implanted perpendicularly to the semiconductor substrate 21 using the gate electrode 24 as a mask. By so doing, a second n-type impurity layer 26a is formed in self-alignment with the gate electrode 24. The ion implantation energy at this time is 30 to 50 keV, and its dose is $5 \times 10^{12}$ to $5 \times 10^{13}$ cm$^{-2}$.

Figure 8B:
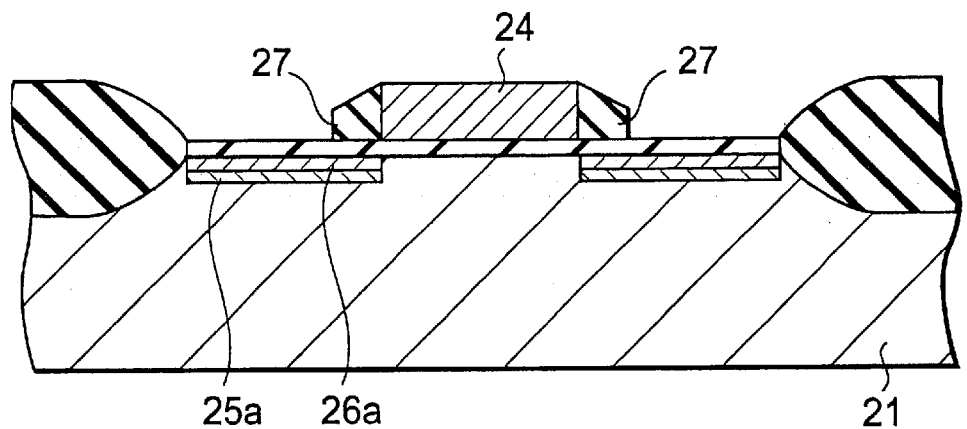

Next, as shown in FIG. 8(b), an oxide film is formed on the entire surface by CVD to a thickness of 100 to 200 nm, and a sidewall insulating film 27 is formed on the sidewall of the gate electrode 24 by etching back the oxide film by an isotropic etching. The n-type impurity layers 25a and 26a located below the sidewall insulating film 27 thus formed serve as an LDD region.

Figure 8C:
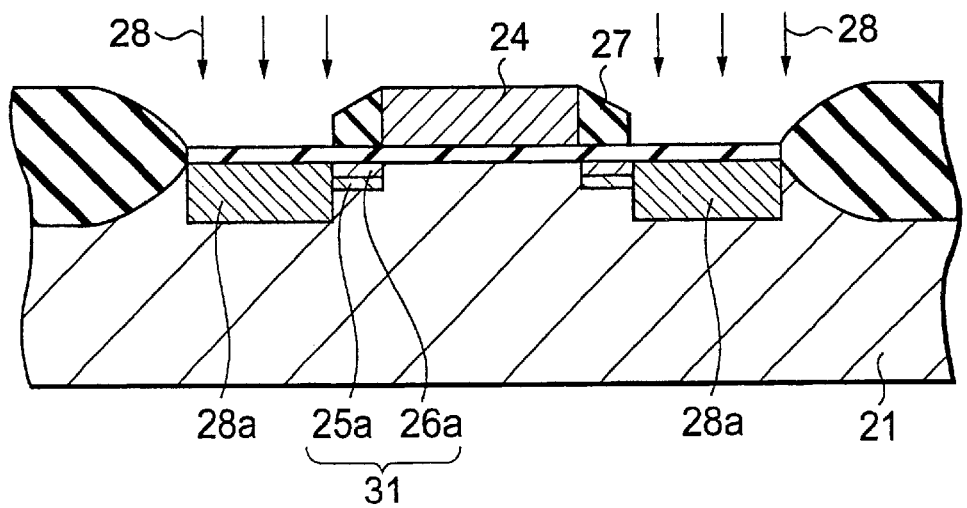

Next, as shown in FIG. 8(c), ions of arsenic 28 are implanted perpendicularly to the semiconductor substrate 1 using the gate electrode 24 and the sidewall insulating film 27 as masks. By so doing, a third n-type impurity layer 28a is formed in self-alignment with the gate electrode 24 and the sidewall insulating film 27. The ion implantation energy at this time is 30 to 50 keV, and its dose is $1 \times 10^{15}$ to $5 \times 10^{15}$ cm$^{-2}$.

Then, the sample is subjected to a heat treatment in order to activate these impurity regions. This heat treatment may be done as a heat treatment for a reflow process to be introduced later.

Figure 9:
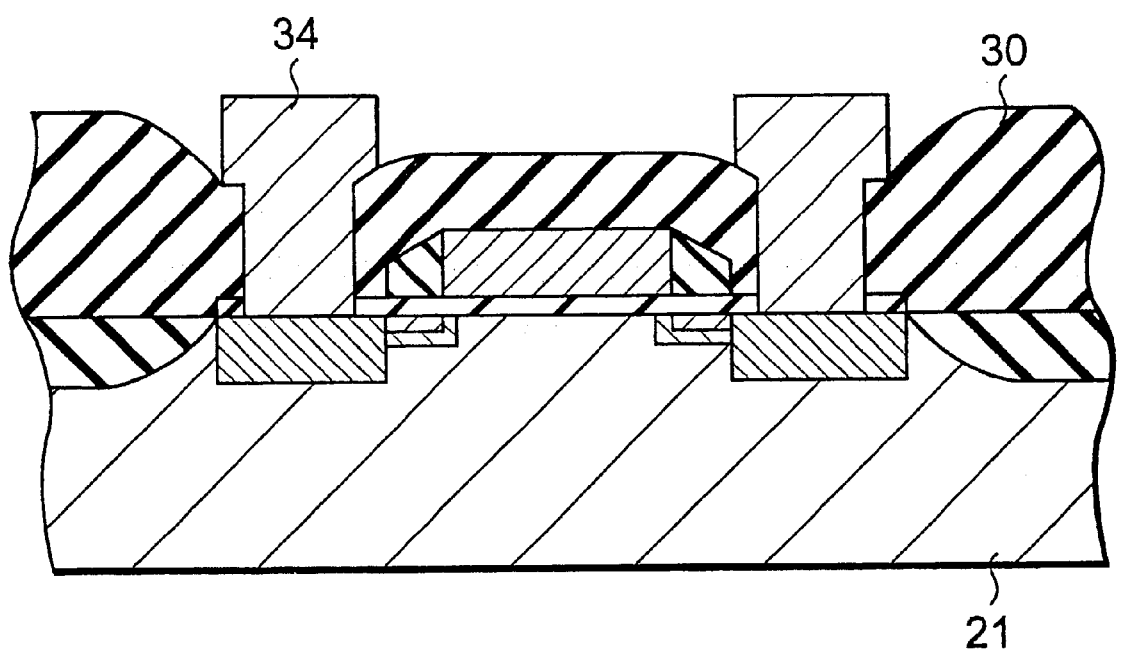
FIG. 9 shows a sectional view for the step following the steps of FIG. 8(a) to FIG. 8(c)
Figure 10A:
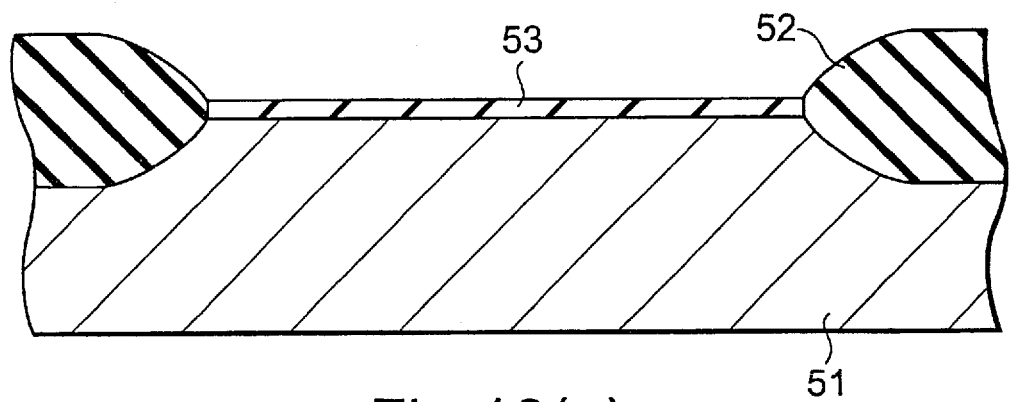
FIGS. 10(a) to 10(c) shows sectional views arranged in the order of conventional fabrication processes of the MOS transistor having a double drain structure.
Figure 10B:
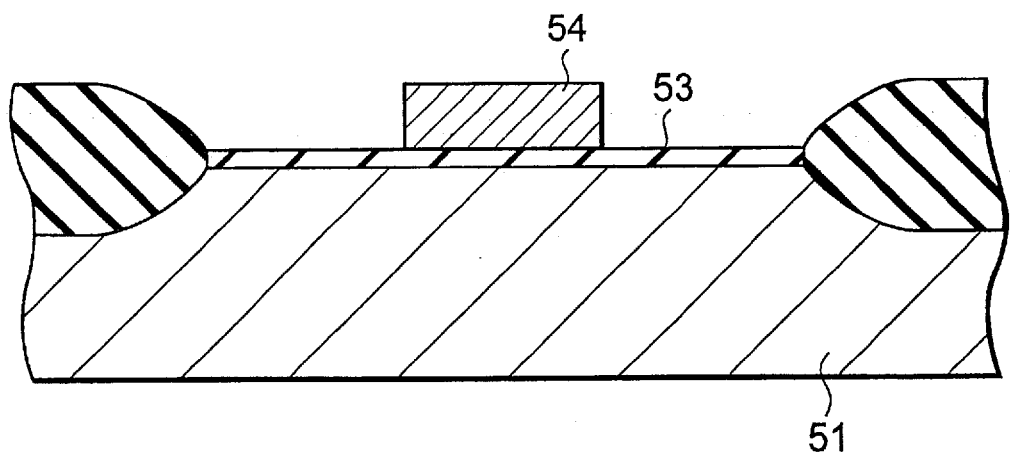
Figure 10C:
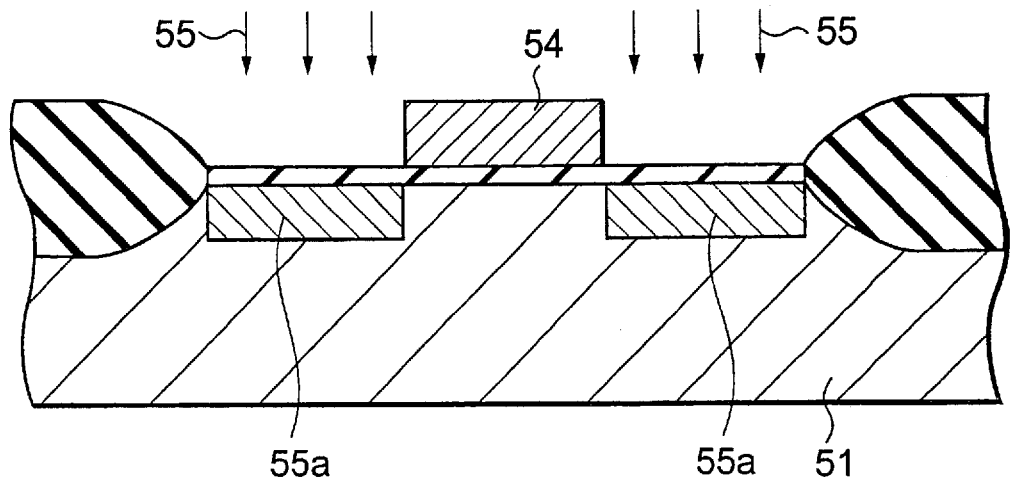
Figure 11A:
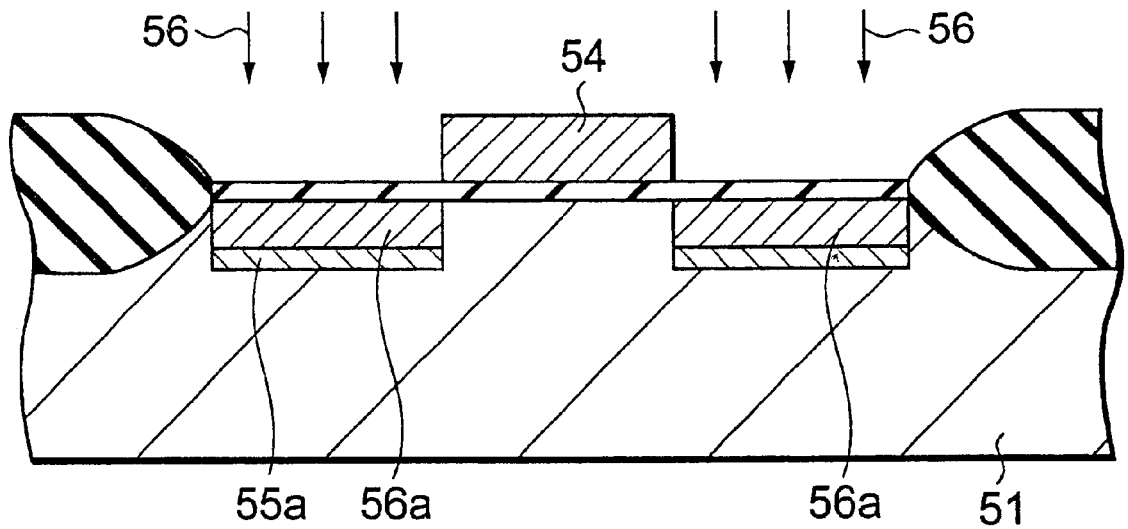
FIGS. 11(a) and 11(b) shows sectional views for the steps following the steps of FIG. 10(a) to FIG. 10(c)
Figure 11B:
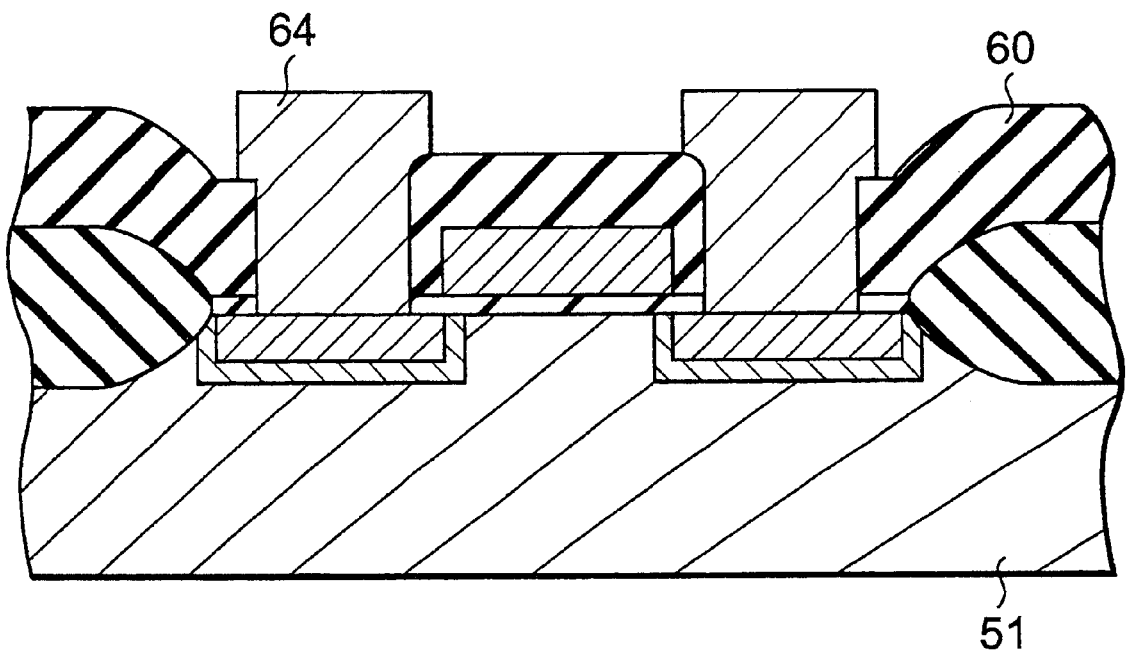
Figure 12A:
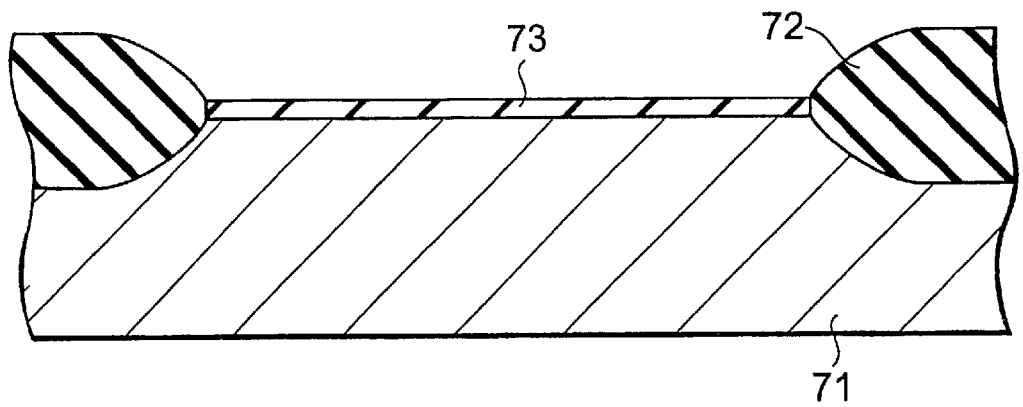
FIGS. 12(a) to 12(c) shows sectional views arranged in the order of conventional fabrication processes of the MOS transistor having LDD structure.
Figure 12B:
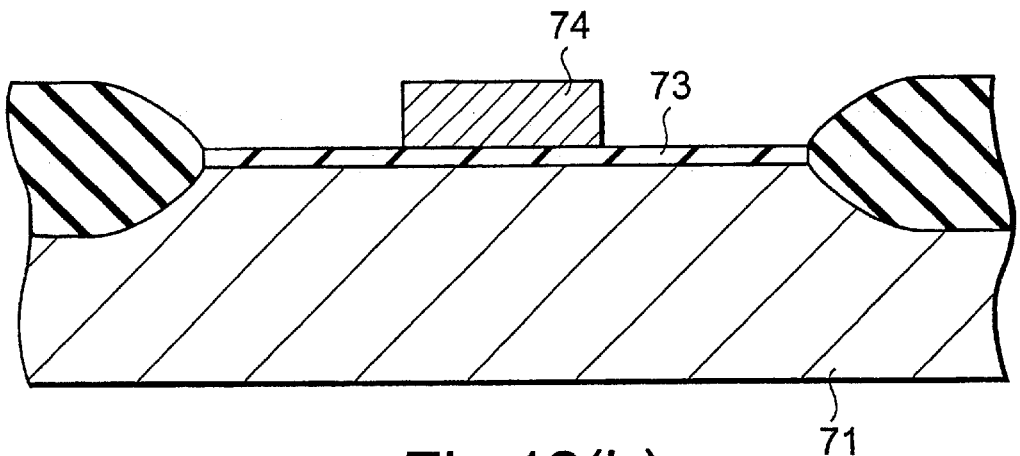
Figure 12C:
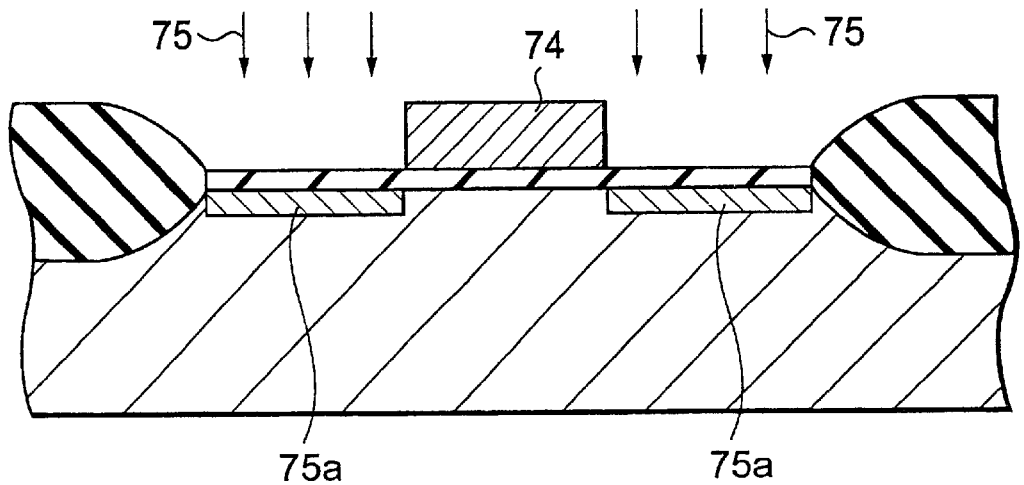
Figure 13A:
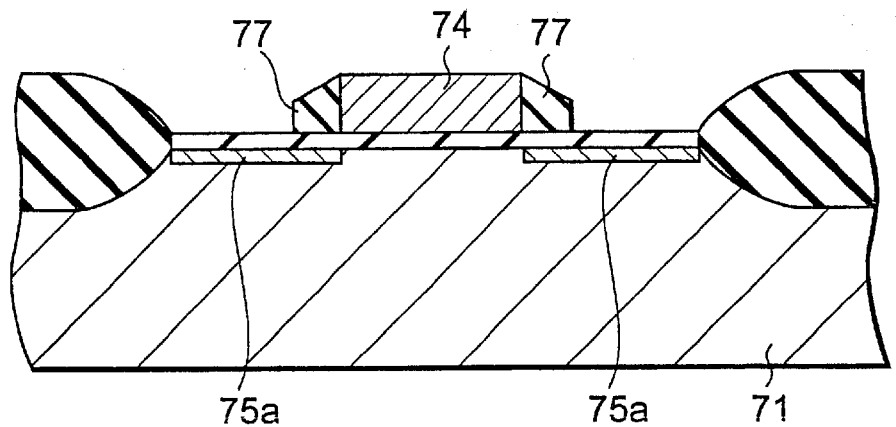
FIGS. 13(a) to 13(c) shows sectional views for the steps following the steps of FIG. 12(a) to FIG. 12(c)
Figure 13B:
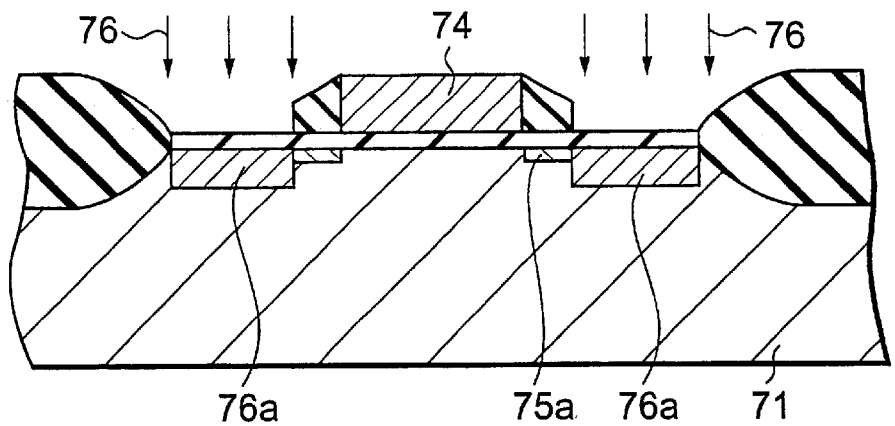
Figure 13C:
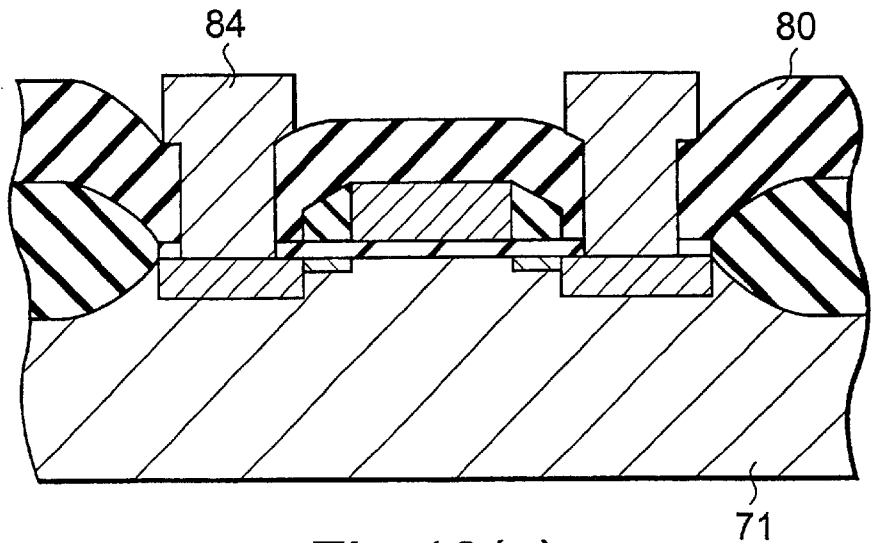
Figure 14A:
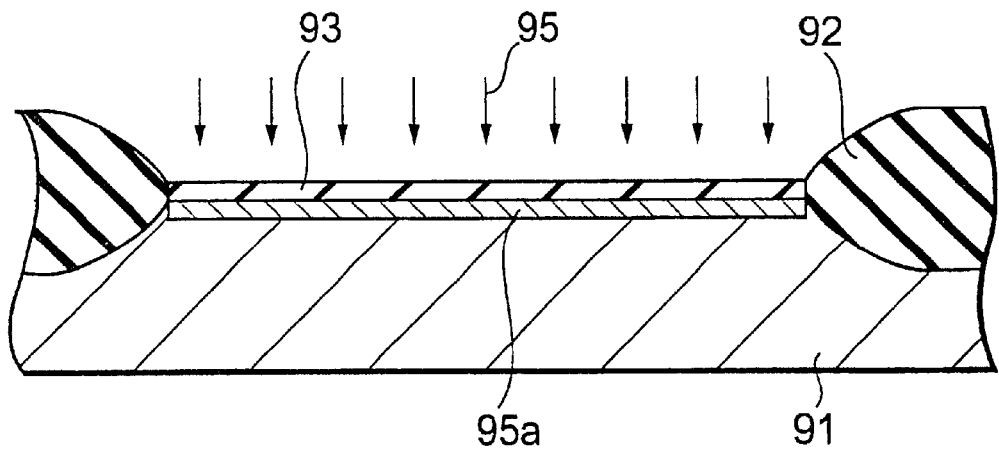
FIGS. 14(a) to 14(c) shows sectional views arranged in the order of fabrication processes of the MOS transistor disclosed in Publication of Unexamined Patent Applications, No. Sho 63-73669.
Figure 14B:
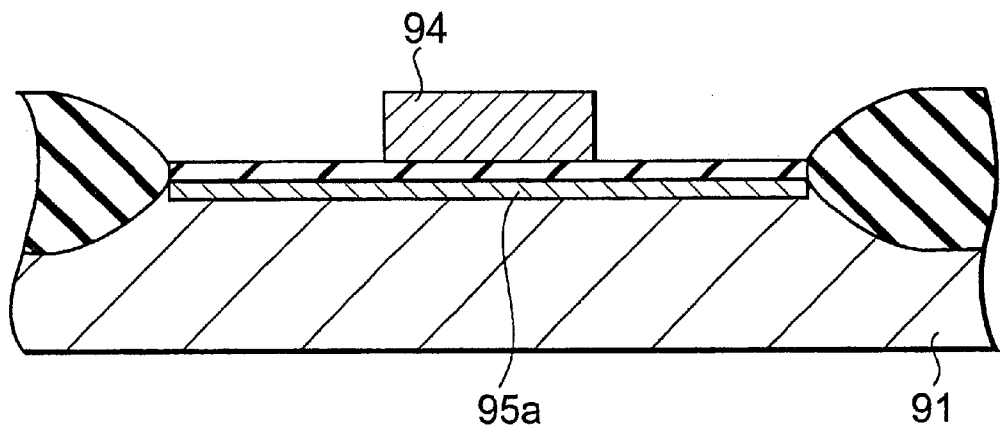
Figure 14C:
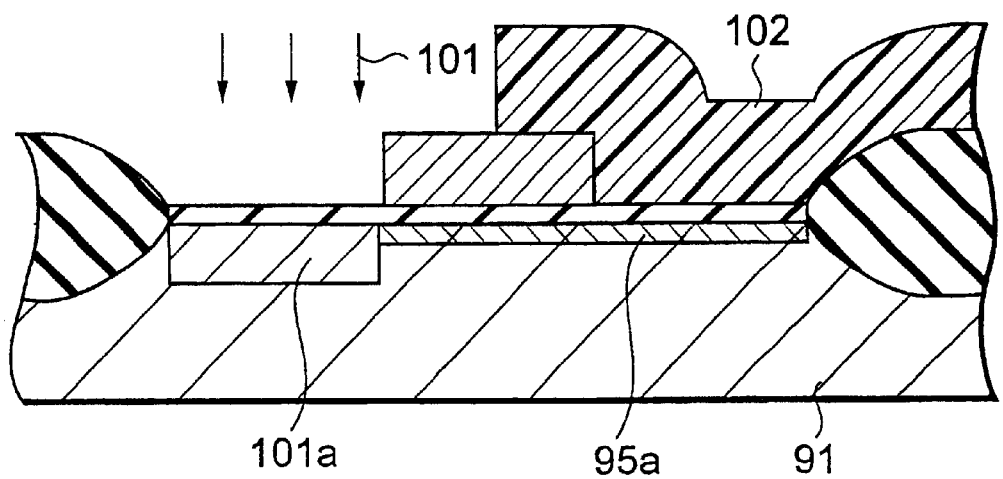
Figure 15A:
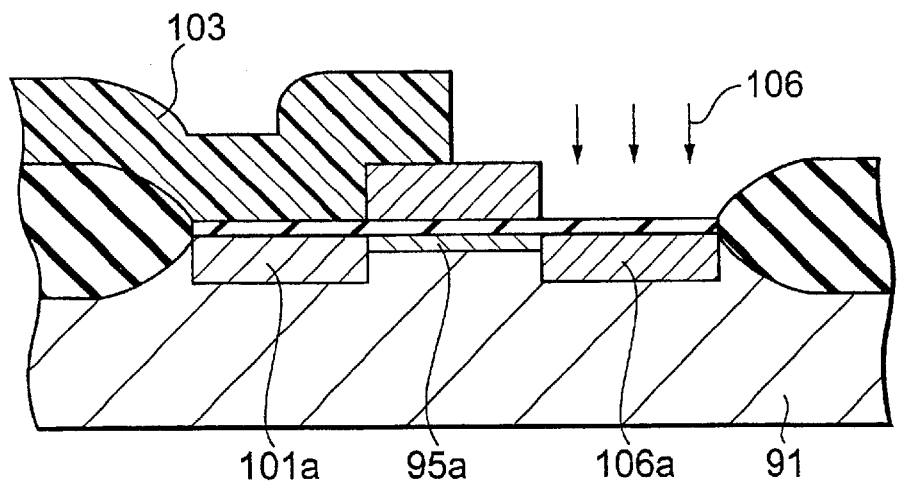
FIGS. 15(a) to 15(c) presents sectional views showing the steps following the steps of FIG. 14(a) to FIG. 14(c).
Figure 15B:
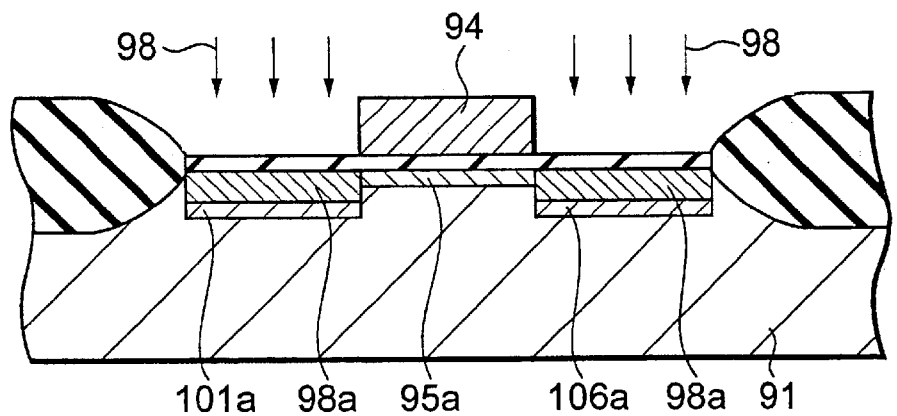
Figure 15C:
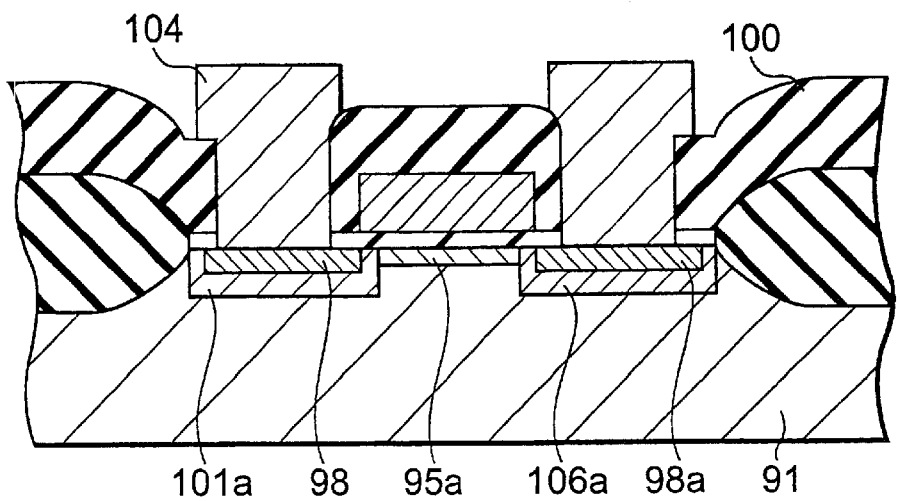

Then, as shown in FIG. 9, after depositing a layer insulating film 30 on the entire surface and formation of a contact hole, a metallic wiring 34 is formed selectively, completing the MOS transistor according to this embodiment.

The MOS transistor of this embodiment differs from the MOS transistor described in the above in the point that the heavily doped region is not formed in a double structure. However, the LDD region 31 is formed as a double drain structure, so it is also possible to suppress the enhancement of the electric field while minimizing the short channel effect. Moreover, since the low concentration impurity 25 or 26 in the third n-type impurity layer 28a, being the heavily doped region, diffuses to the lightly doped region 31 to reduce the parasitic capacitance of the lightly doped region 31, it is possible to prevent the deterioration in the current drive capability.

Moreover, the MOS transistor according to this embodiment has simplified fabrication processes than in the MOS transistor described above, so it is possible to further reduce the fabrication cost.

As in the above, in the MOS transistor according to this invention, the impurity diffused layer forming the LDD region is composed of two layers containing two kinds of ions, of the same conductivity type and having mutually different diffusion coefficients, to form a double drain structure. Two kinds of ions of the same conductivity type with mutually different diffusion coefficients are, for example, phosphorus and arsenic described in the above embodiments.

Accordingly, by ion implanting arsenic with relatively small diffusion coefficient to an extent which does not change appreciably the total amount of the n-type impurities in the LDD region, it is possible to suppress the short channel effect. Moreover, by implanting phosphorus ions it is possible to reduce the parasitic capacitance, and relax the concentration gradient by which the change in the carrier distribution is reduced and the electric field strength is relaxed to reduce the generation of the hot carriers.

Moreover, when the heavily doped region 12 is also given a double drain structure as in the first embodiment, the effective n-type impurity concentration of the LDD region is increased, and improved effect of electric field relaxation can be obtained and the generation of the hot carriers is suppressed.

Further, the first n-type impurity or the second n-type impurity, or both of them may be ion implanted in a direction tilted against the thickness direction of the semiconductor substrate.

Further, the first embodiment and the second embodiment have been described in conjunction with an n-channel MOSFET, but this invention can be applied to a p-channel MOSFET. In that case, it is only necessary to invert the conductivity type of each impurity to the opposite conductivity type.

As described in detail in the above, according to this invention, the LDD region of the source-drain diffused layer of the MOS transistor is given a double structure, so that it is possible to suppress simultaneously the hot carrier generation and the short channel effect without deteriorating the current drive capability. In this way, the reliability of the device can be enhanced. Moreover, by giving a double drain structure also to the heavily doped region of the source-drain diffused layer, these effects can be improved further. Moreover, fabrication of semiconductors with such a structure requires no increase in the number of lithography processes, so it is possible to prevent the increase in the cost and the time for fabrication.

Furthermore, the present invention is not limited to the embodiment described above, and various modifications are possible within the spirit of the invention. For example, two ions of the same conductivity type with different diffusion coefficients need not be limited to phosphorus and arsenic as in the embodiments, and either one or both may be ions different from these.

What is claimed is:

1. A semiconductor device comprising:
   a semiconductor substrate having a channel region;
   a gate insulating film formed on said channel region;
   a gate electrode formed on said insulating film, said gate electrode having side surfaces;
   side walls, each side wall formed on an associated one of said side surfaces of said gate electrode;
   source and drain regions formed in said semiconductor substrate, each of said source and drain regions having a heavily doped region; and
   lightly doped drain ("LDD") regions formed in said semiconductor substrate and contacting an associated heavily doped region, each of which LDD regions is covered with an associated one of said side walls;
   each of said LDD regions including a first region of a first impurity of a first conductivity type and a second region of a second impurity of the first conductivity type, said first region having a first impurity concentration distribution that has a concentration peak at a first depth from a surface of said channel, said second region having a second impurity concentration distribution that has a concentration peak at said first depth substantially from said surface of said channel,
   each of said source and drain regions including a third region of a third impurity of the first conductivity type and a fourth region of a fourth impurity of the first conductivity type,
   the diffusion coefficient of the first impurity being different from the diffusion coefficient of the second impurity, and
   the diffusion coefficient of the third impurity being different from the diffusion coefficient of the fourth impurity.

2. The semiconductor device as claimed in claim 1, wherein said first and third impurities are arsenic and said second and fourth impurities are phosphorus.

3. The semiconductor device as claimed in claim 1, wherein said first and second impurities are phosphorus and arsenic.

4. The semiconductor device as claimed in claim 1, wherein one of said third and fourth impurities is the same as one of said first and second impurities.

5. The semiconductor device as claimed in claim 1, wherein said third impurity is the same as said first impurity and said fourth impurity is the same as said second impurity and both said first and second regions contact an associated one of said source and drain regions.

6. The semiconductor device as claimed in claim 1, wherein each of said source and drain regions includes both phosphorus and arsenic.

* * * * *